United States Patent
Horikiri et al.

(10) Patent No.: US 9,166,142 B2
(45) Date of Patent: Oct. 20, 2015

(54) MANUFACTURING METHOD OF PIEZOELECTRIC FILM ELEMENT, PIEZOELECTRIC FILM ELEMENT AND PIEZOELECTRIC DEVICE

(75) Inventors: Fumimasa Horikiri, Nagareyama (JP); Kenji Shibata, Tsukuba (JP); Kazufumi Suenaga, Tsuchiura (JP); Kazutoshi Watanabe, Tsuchiura (JP); Akira Nomoto, Kasumigaura (JP)

(73) Assignee: Sciocs Company Limited, Hitachi-shi, Ibaraki-ken (JP)

(*) Notice: Subject to any disclaimer, the term of this patent is extended or adjusted under 35 U.S.C. 154(b) by 421 days.

(21) Appl. No.: 13/567,157

(22) Filed: Aug. 6, 2012

(65) Prior Publication Data
US 2013/0038176 A1   Feb. 14, 2013

(30) Foreign Application Priority Data
Aug. 10, 2011 (JP) .................. 2011-174981

(51) Int. Cl.
- H01L 41/332 (2013.01)
- H01L 41/08 (2006.01)
- H01L 41/047 (2006.01)
- H01G 5/18 (2006.01)
- H01L 41/09 (2006.01)
- H01L 41/187 (2006.01)

(52) U.S. Cl.
CPC ............ H01L 41/332 (2013.01); H01G 5/18 (2013.01); H01L 41/047 (2013.01); H01L 41/0805 (2013.01); H01L 41/094 (2013.01); H01L 41/1873 (2013.01)

(58) Field of Classification Search
None
See application file for complete search history.

(56) References Cited

U.S. PATENT DOCUMENTS

| | | | |
|---|---|---|---|
| 8,058,779 B2 | 11/2011 | Suenaga et al. | |
| 2001/0042291 A1* | 11/2001 | Esashi et al. | ............. 29/25.35 |
| 2009/0236933 A1 | 9/2009 | Takahashi et al. | |
| 2009/0302715 A1 | 12/2009 | Shibata et al. | |
| 2010/0206073 A1* | 8/2010 | Kaminishi et al. | ......... 73/504.12 |
| 2012/0062074 A1 | 3/2012 | Hahiro | |

FOREIGN PATENT DOCUMENTS

| | | |
|---|---|---|
| JP | 10-286953 | 10/1998 |
| JP | 2007-19302 | 1/2007 |
| JP | 2009-231405 A | 10/2009 |
| JP | 2009-295786 A | 12/2009 |
| JP | 2009-302381 | 12/2009 |
| JP | 2010-161330 A | 7/2010 |
| JP | 2012-056194 A | 3/2012 |

OTHER PUBLICATIONS

Office Action issued in a related Japanese application No. 2011-174981 on Jun. 18, 2013.
Fumimamsa Horikiri et al. "Etching Characteristics of (K, Na)NbO3 piezoelectric films by Ar-ChF3 plasma" the 71st Annual Conference of Japan Society of Applied Physics, Lecture Proceedings, 16p-NJ-10 (2010)) and its English translation. Sep. 14-17, 2010.

* cited by examiner

*Primary Examiner* — Duy Deo
(74) *Attorney, Agent, or Firm* — Roberts Mlotkowski Safran & Cole, PC

(57) ABSTRACT

A manufacturing method of a piezoelectric film element includes forming a piezoelectric film including a lead-free alkali niobate based compound having a perovskite structure represented by a compositional formula of $(K_{1-x}Na_x)NbO_3$ on a substrate, and dry-etching the piezoelectric film by using a low-pressure plasma including a fluorine system reactive gas.

3 Claims, 4 Drawing Sheets

1 PIEZOELECTRIC FILM ELEMENT
5 PIEZOELECTRIC FILM
4 LOWER ELECTRODE
3 FIRMLY ADHERING LAYER
2 SUBSTRATE

MANUFACTURING METHOD OF PIEZOELECTRIC FILM ELEMENT, PIEZOELECTRIC FILM ELEMENT AND PIEZOELECTRIC DEVICE

The present application is based on Japanese patent application No. 2011-174981 filed on Aug. 10, 2011, the entire contents of which are incorporated herein by reference.

BACKGROUND OF THE INVENTION

1. Field of the Invention

This invention relates to a manufacturing method of piezoelectric film element, a piezoelectric film element and a piezoelectric device.

2. Description of the Related Art

A piezoelectric material is processed so as to form various piezoelectric elements in accordance with a variety of the intended uses, in particular, is widely used as a functional electronic component such as an actuator that allows an object to be changed in shape when an electric voltage is applied thereto, a sensor that generates an electric voltage due to the change in shape of the element.

As the piezoelectric material that is used for the application of the actuator and the sensor, a lead-based ceramics that has a large piezoelectric property, in particular, a $Pb(Zr_{1-x}Ti_x)O_3$ based perovskite type ferroelectric that is referred to as a PZT has been widely used. The PZT ceramics is formed by sintering oxide materials.

On the other hand, at present, various electronic components become more downsized and upgraded, thus it is strongly needed for the piezoelectric element to be downsized and upgraded. However, a piezoelectric material manufactured by a conventional manufacturing method such as a sintering method, particularly if it has a thickness of not more than 10 μm, is configured to have a thickness that is close to the size of the crystal grain constituting the material, thus the influence thereof cannot be ignored. Consequently, a problem is caused that variation and deterioration in the property become prominent. For the purpose of preventing the problem, a forming method of a piezoelectric material in which a thin film technology and the like are applied instead of the sintering method has been investigated.

Recently, a PZT thin film formed by a RF sputtering method is put into practical use as a printer head of a high-definition and high-speed ink-jet printer and a downsized and low-cost angular rate sensor (for example, refer to JP-A-H10-286953). In addition, a piezoelectric film element that uses a lead-free piezoelectric film of potassium niobate is also proposed (for example, refer to JP-A-2007-19302).

When an actuator or a sensor is manufactured by using a piezoelectric film, it is needed for the piezoelectric film to be processed by a microfabrication process so as to have a beam shape or a turning fork shape. However, a lead-free alkali niobate based compound (hereinafter referred to as "KNN" for short) having a perovskite structure that is a lead-free piezoelectric material has a problem that it is a processing resistant material, in addition to this, when the KNN film is etched by using a fluorine (F) system gas, a residue such as KF, NaF remains, so as to reduce a production yield in later processes (e.g., refer to Fumimasa Horikiri et al. "Etching Characteristics of (K, Na)NbO₃ piezoelectric films by Ar—CHF₃ plasma" the 71$^{st}$ Annual Conference of Japan Society of Applied Physics, Lecture Proceedings, 16p-NJ-10 (2010)).

In the microfabrication of the piezoelectric film, if the process is required to be carried out with a high degree of accuracy, it is necessary not only that the piezoelectric film can be processed in a short time, but also that the process can be selectively stopped at a lower electrode layer. In addition, it is necessary to have the piezoelectric film oriented to obtain a high piezoelectric property. Thus it is necessary to use a lower electrode layer of Pt or the like.

As described in Fumimasa Horikiri et al. "Etching Characteristics of (K, Na)NbO₃ piezoelectric films by Ar—CHF₃ plasma", by the inventors et al. of the present application, a manufacturing method is proposed that is capable of processing the KNN film by a dry etching technology using a mixture gas of Ar gas and a reactive gas such as $CHF_3$ gas, and is capable of obtaining a high etching selectivity at the lower electrode layer comprised of Pt, so as to realize the microfabrication of the KNN film.

SUMMARY OF THE INVENTION

Where the microfabrication is carried out by using the above-mentioned dry etching process, it may take a long time of 1 hour or more for processing a typical KNN film with a thickness of 2 to 3 μm. In addition, after etching, a residue such as KF, NaF may be left which reduces a production yield in the subsequent process.

Accordingly, it is an object of the invention to provide a manufacturing method of a piezoelectric film element that is capable of enhancing the etching rate when the microfabrication is carried out by the dry etching, and reducing the etching residue so as to increase reliability in the subsequent process, as well as to provide a piezoelectric film element and a piezoelectric device.

The present inventors have studied the improvement of processability in the dry etching, taking into account the relationship between the processability of KNN and the density of fluorine system ion such as $CF^{2+}$ or the ion collision energy. As a result, the present inventors have found that when the dry etching process is conducted by using fluorine system reactive gas and low-pressure plasma, the KNN film can be processed in a short time and over-etched to sufficiently remove the etching residue.

(1) According to one embodiment of the invention, a manufacturing method of a piezoelectric film element comprises:

forming a piezoelectric film comprising a lead-free alkali niobate based compound having a perovskite structure represented by a compositional formula of $(K_{1-x}Na_x)NbO_3$ on a substrate; and dry-etching the piezoelectric film by using a low-pressure plasma including a fluorine system reactive gas.

In the above embodiment (1) of the invention, the following modifications and changes can be made.

(i) The forming of the piezoelectric film comprises:

forming a lower electrode comprised of a metal that contains Pt on the substrate; and forming the piezoelectric film on the lower electrode, wherein the dry-etching of the piezoelectric film comprises etching the piezoelectric film under a condition that an etching selectivity of the piezoelectric film and the lower electrode is not less than 20.

(ii) The dry-etching of the piezoelectric film comprises using a mixed gas of at least one fluorine system reactive gas selected from the group consisting of $CHF_3$, $C_2F_6$, $CF_4$, $SF_6$, $C_4F_8$ and $C_3F_7I$, and Ar, or a mixed gas of ones of the fluorine system reactive gas.

(iii) The dry-etching is conducted in a chamber at an internal pressure of not more than 2.5 Pa.

(2) According to another embodiment of the invention, a piezoelectric film element comprises:

a substrate;

a lower electrode formed on the substrate and comprised of (111) oriented Pt; and a piezoelectric film comprising a lead-free alkali niobate based compound having a perovskite structure represented by a compositional formula of $(K_{1-x}Na_x)NbO_3$ formed on the lower electrode.

In the above embodiment (2) of the invention, the following modifications and changes can be made.

(iv) The lower electrode has an arithmetic average surface roughness (Ra) of not more than 1 nm.

(v) The piezoelectric film has a pseudo-cubic crystal structure, and is formed so as to be preferentially oriented in a direction of (001) plane.

(vi) The piezoelectric film comprises the lead-free alkali niobate based compound having a perovskite structure represented by the compositional formula of $(K_{1-x}Na_x)NbO_3$, where x is in the range of not less than 0.425 and not more than 0.730.

(3) According to another embodiment of the invention, a piezoelectric device comprises:

the piezoelectric film element according to the above embodiment (2);

an upper electrode formed on the piezoelectric film; and an electric voltage applying means or an electric voltage detecting means connected to the lower electrode and the upper electrode.

EFFECTS OF THE INVENTION

According to one embodiment of the invention, a manufacturing method of a piezoelectric film element can be provided that is capable of enhancing an etching rate even when the microfabrication is carried out by dry etching, and reducing an etching residue so as to increase a reliability in the subsequent processes, as well as a piezoelectric film element and a piezoelectric device.

BRIEF DESCRIPTION OF THE DRAWINGS

The preferred embodiments according to the invention will be explained below referring to the drawings wherein.

DETAILED DESCRIPTION OF THE PREFERRED EMBODIMENTS

Figure 1:
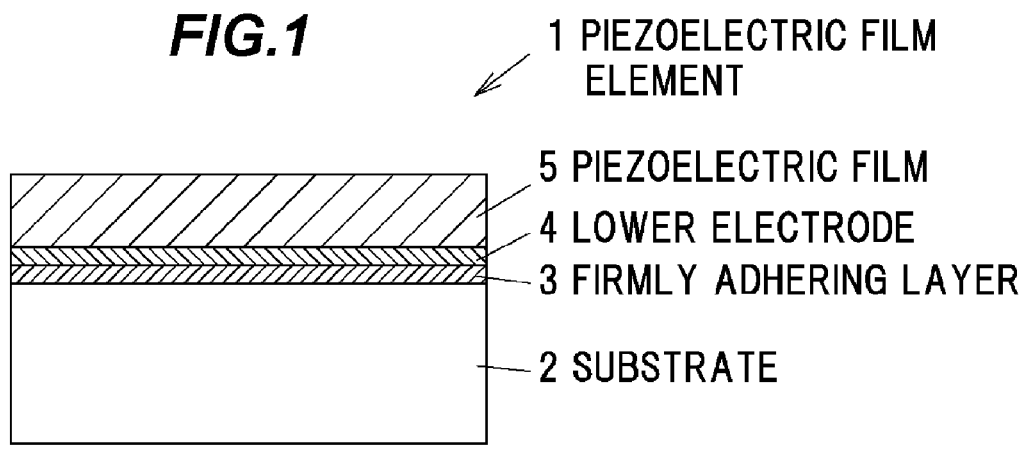
FIG. 1 is a cross-sectional view schematically showing a piezoelectric film element according to a first embodiment of the invention.

The preferred embodiments according to the invention will be explained below referring to the drawings. Meanwhile, in the drawings, an element with substantially the same function is indicated by the same numeral. Thus, the duplicated explanation of the element will be omitted below.

A manufacturing method of a piezoelectric film element according to the embodiment includes, forming a piezoelectric film comprising a lead-free alkali niobate based compound having a perovskite structure represented by a compositional formula of $(K_{1-x}Na_x)NbO_3$ on a substrate; and dry-etching the piezoelectric film including a fluorine system reactive gas by using a low-pressure plasma.

The dry etching is applied to the piezoelectric film including a lead-free alkali niobate based compound having a perovskite structure represented by a compositional formula of $(K_{1-x}Na_x)NbO_3$ including a fluorine system reactive gas, thereby the microfabricating can be carried out in a short time. In addition, the low-pressure plasma is used in the dry etching, thereby a fluorine system ion can be supplied to the interface in a state of maintaining a certain level of collision energy.

Here, the low-pressure plasma means a plasma treatment that is carried out in a chamber at an internal pressure of 0.05 to 5.0 Pa.

First Embodiment

FIG. 1 is a cross-sectional view schematically showing a piezoelectric film element according to a first embodiment of the invention.

The piezoelectric film element 1 includes a substrate 2, a firmly adhering layer 3 formed on the substrate 2, a lower electrode 4 formed on the firmly adhering layer 3, and a piezoelectric film 5 formed on the lower electrode 4 in a predetermined pattern by dry etching.

As the substrate 2, for example, a Si substrate, a MgO substrate, a $SrTiO_3$ substrate, a $SrRuO_3$ substrate, a glass substrate, a quartz glass substrate, a GaAs substrate, a GaN substrate, a sapphire substrate, a Ge substrate, a metal substrate such as a stainless substrate, can be used. In the embodiment, the Si substrate that is low cost and is industrially proven is used. In addition, a (001) plane Si substrate with a thermally-oxidized film can be used. Also, Si substrate with a different plain direction, a Si substrate without the thermally-oxidized film and a SOI substrate can be used.

The firmly adhering layer 3 is used in order to heighten the adhesion between the substrate 2 and the lower electrode 4 and simultaneously to allow the lower electrode 4 to have a predetermined orientation, and Ti, Ta and the like can be used. Further, in the embodiment, Ti is used as the firmly adhering layer 3, however, even if Ta and the like other than Ti are used or the firmly adhering layer itself is not used, similar effect can be also obtained by controlling the plane direction of the lower electrode 4.

As the lower electrode 4, an electrode layer that is comprised of Pt or an alloy that contains Pt as a main component, or an electrode layer that is configured to have a lamination structure of a Pt film and an alloy film that contains Pt as a main component can be used. In the embodiment, the lower electrode 4 is used that is comprised of (111) oriented Pt. By configuring the lower electrode 4 to be (111) oriented, the piezoelectric film 5 formed on the lower electrode 4 can be preferentially oriented in the direction of (001) plane.

The piezoelectric film 5 is comprised of a lead-free alkali niobate based compound having a perovskite structure, i.e., KNN. In particular, KNN is represented by a compositional formula of $(K_{1-x}Na_x)NbO_3$, where x is in the range of, e.g., not less than 0.425 and not more than 0.730. In addition, it is preferable that the perovskite structure is a pseudo-cubic crystal type. Further, in the embodiment, the other elements are not particularly added to the KNN film, but Li, Ta, Sb, Ca, Cu, Ba, Ti or the like can be added to the KNN film in an additive amount of not more than 5%.

Manufacturing Method of Piezoelectric Film Element

Next, one example of a manufacturing method of the above-mentioned piezoelectric film element 1 will be explained.

As the substrate 2, a Si substrate with a thermally-oxidized film is prepared, the firmly adhering layer 3 comprised of Ti is formed on the substrate 2, and the lower electrode 4 comprised of Pt is formed on the Ti firmly adhering layer 3.

Next, the piezoelectric film (may be referred to as "KNN film") 5 comprised of $(K_{1-x}Na_x)NbO_3$ is formed on the lower electrode 4 by a RF magnetron sputtering method. Hereinafter, the substrate 2 after the piezoelectric film 5 is formed may be referred to as "substrate with KNN film".

The piezoelectric film 5 is formed as a film by using a sintered ceramics of $(K_{1-x}Na_x)NbO_3$ wherein x is included in a range of not less than 0.425 and not more than 0.730, as a target, and under the conditions of substrate temperature of 520 degrees C., RF power of 700 W, mixing ratio of $O_2/Ar$ of 0.005, and chamber internal pressure of 1.3 Pa. The sputtering time for film formation of the piezoelectric film 5 is configured such that the film thickness becomes approximately 2 μm.

Next, a Cr mask pattern is formed as a mask on the substrate with KNN film. Further, even if Ta, W or Ti other than Cr is used as the mask, a microfabrication can be similarly applied thereto. In addition, even if a laminated film comprised of any of Cr, Ta, W and Ti is used as the mask, the microfabrication can be similarly applied thereto.

Next, the microfabrication is applied to the piezoelectric film 5 of the substrate with KNN film by dry etching in which the low-pressure plasma is used, while the Cr mask pattern is used as the mask.

The dry etching is carried out by using an Inductive Coupled Plasma-Reactive Ion Etching (ICP-RIE), and by using a mixed gas of Ar and $C_4F_8$ as a reactive gas. Further, as the reactive gas, even if a mixed gas of at least one of fluorine system reactive gases other than $C_4F_8$ such as $CHF_3$, $C_2F_6$, $CF_4$, $SF_6$, $C_3F_7I$ and Ar, or a mixture gas of the fluorine system reactive gases themselves is used, an effect can be similarly obtained. In addition, even if a mixture gas to which an inactive gas other than Ar such as $N_2$ or $O_2$, He, or a chlorine system reactive gas such as Cl, BCl is added in an extremely small amount is used, the effect can be similarly expected.

The internal pressure of the chamber in which the dry etching is carried out is preferably not more than 5.0 Pa, and more preferably not more than 2.5 Pa. If the chamber internal pressure is not more than 5.0 Pa, then the etching residue can be sufficiently removed by over-etching.

In addition, as the preferable condition of over-etching, it is preferable that the etching selectivity between the piezoelectric film 5 and the lower electrode 4 (the etching rate of piezoelectric film 5/the etching rate of lower electrode 4) is not less than 20 so as not to eliminate the lower electrode 4, thus the antenna power is preferably not less than 500 W, and more preferably not less than 600 W, and the bias power is preferably not more than 100 W, and more preferably not more than 50 W.

Advantages of the First Embodiment

According to the first embodiment, the following advantages are provided.

(a) The dry etching of the KNN film is conducted including a fluorine system reactive gas, whereby the KNN film can be microfabricated in a short time.

(b) The dry etching is conducted by using a low-pressure plasma, whereby a fluorine system ion such as $CF_2^+$ can be supplied to the interface with a certain level of collision energy.

As a result, the etching rate, the selectivity and the like can be significantly improved, and the over-etching can be applied to the KNN film such that the etching residue after etching such as KF, NaF can be sufficiently removed.

Second Embodiment

Figure 2:
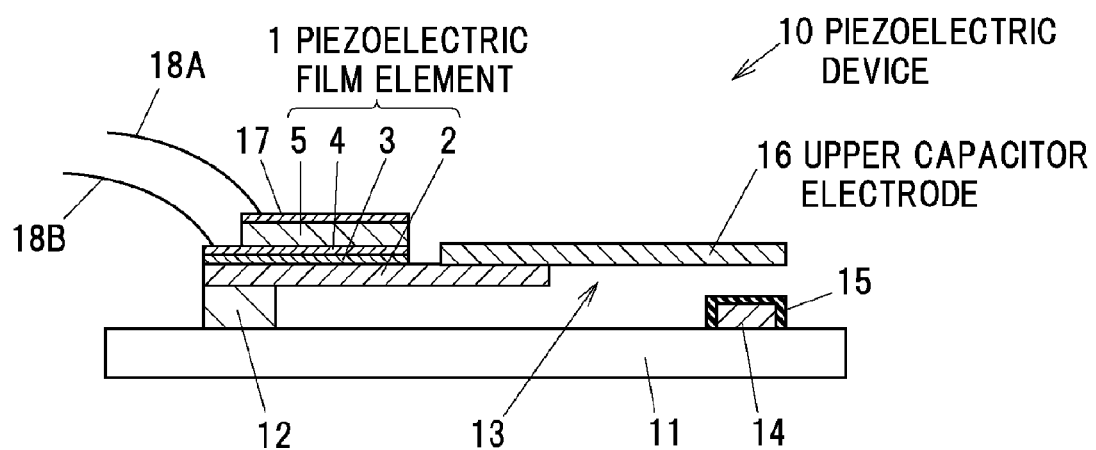
FIG. 2 is a cross-sectional view schematically showing a piezoelectric device according to a second embodiment of the invention.

FIG. 2 is a cross-sectional view schematically showing a piezoelectric device according to a second embodiment of the invention. The second embodiment relates to the case that the piezoelectric film element 1 according to the first embodiment is applied to a variable capacitor.

The piezoelectric device 10 includes a device substrate 11, an insulation layer 12 formed on the device substrate 11, and a piezoelectric film element 1 similar to that of the first embodiment formed on the insulation layer 12. The device substrate 11 and the insulation layer 12 function as a supporting member that supports one end portion of the piezoelectric film element 1.

The piezoelectric film element 1 is configured similarly to that of the first embodiment, such that the firmly adhering layer 3, the lower electrode 4 and the piezoelectric film 5 are formed on the substrate 2. In a case of the second embodiment, an upper electrode 17 is formed on the piezoelectric film 5 of the piezoelectric film element 1. In addition, the substrate 2 of the piezoelectric film element 1 in the second embodiment is configured such that an upper capacitor electrode 16 is disposed on the projecting part thereof.

A lower capacitor electrode 14 is formed on the device substrate 11 so as to be located below the upper capacitor electrode 16 via a space 13, and an insulation layer 15 comprised of SiN or the like is formed on the surface of the lower capacitor electrode 14.

In addition, when electric voltage is applied to the upper electrode 17 and the lower electrode 4 from an electric voltage applying means connected to the upper electrode 17 and the lower electrode 4 via each of bonding wires 18A, 18B, the end portion of the piezoelectric film element 1 is displaced, in association with this, the upper capacitor electrode 16 is displaced in the vertical direction. Due to the displacement of the upper capacitor electrode 16, capacitor between the upper capacitor electrode 16 and the lower capacitor electrode 14 is changed, so that the piezoelectric device 10 operates as a variable capacitor.

Advantages of the Second Embodiment

According to the second embodiment, by using the microfabrication process of the KNN film according to the first embodiment, it is possible to provide a piezoelectric device that is capable of providing a high insulation property and a sufficient piezoelectric property. In addition, it is possible to manufacture a printer head for ink-jet printer or an angular rate sensor that is reduced in an environment load at the same reliability and manufacturing cost as those of conventional product.

In the above-mentioned embodiment, a variable capacitor has been explained as an actuator, but the piezoelectric film element according to the first embodiment can be also applied to the other actuator, or a piezoelectric device such as a sensor, a filter device, a Micro Electro Mechanical Systems (MEMS) device. The other actuator includes a printer head for ink-jet printer, a scanner, an ultrasonic generator, and the like. In addition, the sensor includes an angular rate sensor, an ultrasonic sensor, a pressure sensor, a velocity-acceleration sensor, and the like. Further, when the piezoelectric device is used as the sensor, an electric voltage detection means is connected to the upper electrode 17 and the lower capacitor electrode 14.

Hereinafter, a manufacturing method of a piezoelectric film element according to Examples will be explained.

Example 1

First, a manufacturing method of a piezoelectric film element according to Example 1 will be explained.

(1) Preparation of Substrate

As the substrate 2, a wafer of a Si substrate with a thermally-oxidized film (oriented in the direction of (100) plane, 0.525 mm in thickness, the thermally-oxidized film of 205 nm in thickness, 4 inches in wafer size) was used.

(2) Formation of Lower Electrode

First, the firmly adhering layer 3 comprised of Ti having a thickness of 2.3 nm was formed as a film on the substrate 2 by a RF magnetron sputtering method. Next, the lower electrode 4 comprised of Pt having a thickness of 215 nm was formed on the firmly adhering layer 3 by a RF magnetron sputtering method. The Ti firmly adhering layer 3 and the lower electrode 4 were formed as a film under the conditions of substrate temperature of 100 to 350 degrees C., RF power of 200 W, introduced gas of Ar atmosphere, pressure of 2.5 Pa, and film-forming time of 1 to 3 minutes for the firmly adhering layer 3 and 10 minutes for the lower electrode 4.

When an in-plane surface roughness of the lower electrode 4 was measured, an arithmetic average surface roughness (Ra) was not more than 0.86 nm. Further, when the KNN film was formed on the lower electrode 4 of which arithmetic average surface roughness (Ra) was more than 0.86 nm (or 1 nm) so as to manufacture the piezoelectric film element 1, although the piezoelectric film element 1 was useful enough for the piezoelectric device, it was found that the element 1 was decreased in the piezoelectric property. Consequently, in order to allow the KNN film to have a sufficient piezoelectric property, the surface of the lower electrode 4 has an arithmetic average surface roughness (Ra) that is preferably not more than 1 nm, and more preferably not more than 0.86 nm (3) Formation of Piezoelectric Film Next, a $(K_{1-X}Na_X)NbO_3$ thin film was formed on the lower electrode 4 by a RF magnetron sputtering method. The $(K_{1-X}Na_X)NbO_3$ thin film was formed by using a sintered ceramics of $(K_{1-X}Na_X)NbO_3$ where x is in the range of not less than 0.425 and not more than 0.730, as a target, and under the conditions of substrate temperature of 520 degrees C., RF power of 700 W, mixing ratio of $O_2$/Ar of 0.005, and chamber internal pressure of 1.3 Pa. The sputtering time for film formation of the KNN film was configured such that the film thickness became approximately 2 μm.

(4) Formation of Mask Pattern

As described below, a Cr mask pattern was formed as a mask on the substrate with KNN film formed as described above.

First, a Cr film having a thickness of approximately 400 nm was formed on the above-mentioned substrate with KNN film by a RF magnetron sputtering method.

Next, a photoresist such as OFPR-800 was coated, exposed and developed so as to form a resist pattern on the Cr film.

After that, the Cr film was etched by using a Cr etchant such as ceric ammonium nitrate and the photoresist was removed by being washed with acetone, thereby a Cr mask pattern was formed on the KNN film. Further, after dry etching described below, the residual Cr pattern was removed by using the same etchant.

(5) Dry Etching

The substrate with KNN film on which the Cr mask pattern was formed was microfabricated by dry etching. For the dry etching, an ICP-RIE device was used, and as a reactive gas, a mixed gas of Ar and $C_4F_8$ was used. The dry etching was carried out under the conditions of the chamber internal pressure of 0.5 Pa to 6.5 Pa, the mixing ratio of Ar and $C_4F_8$ (Ar/$C_4F_8$) of (50 sccm/5 sccm), the antenna power of 400 to 1000 W, and the bias power of 50 to 250 W.

Figure 3:
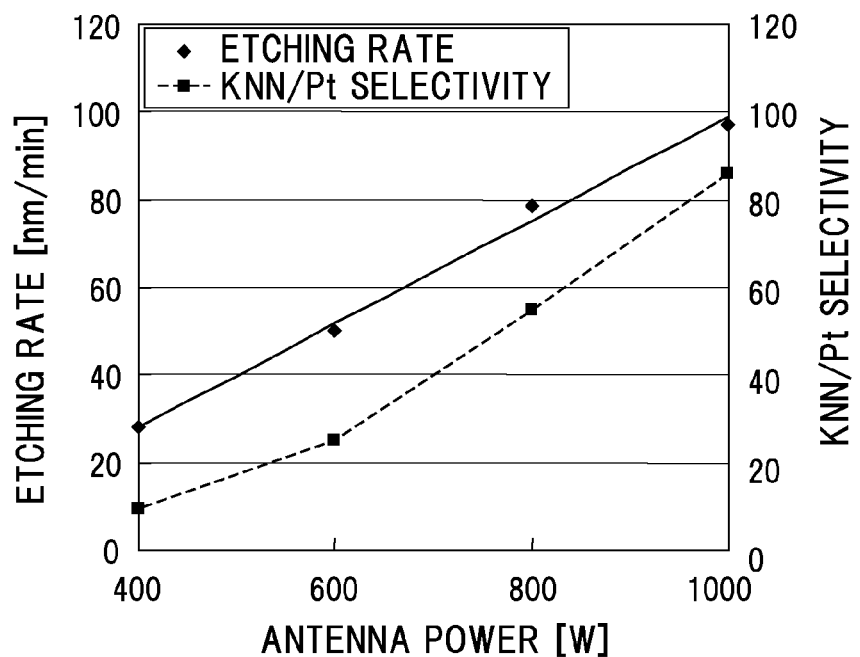
FIG. 3 is a graph showing an antenna power dependence of etching rate and KNN/Pt selectivity of KNN film.
Figure 4:
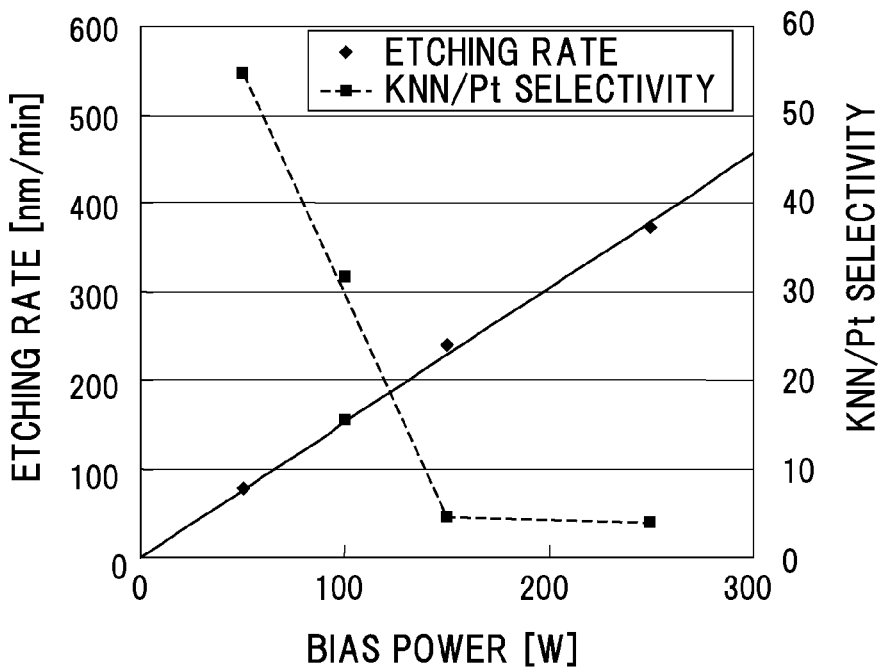
FIG. 4 is a graph showing a bias power dependence of the etching rate and KNN/Pt selectivity of the KNN film.

FIG. 3 is a graph showing an antenna power dependence of etching rate and KNN/Pt selectivity of KNN film under the condition that the bias power is fixed to 50 W. FIG. 4 is a graph showing a bias power dependence of the etching rate and KNN/Pt selectivity of the KNN film under the condition that the bias power is fixed to 800 W. The antenna power was applied by using a power supply having a frequency of 13.56 MHz. The bias power was applied to the side of substrate by using a power supply having a frequency of 12.5 MHz.

Table 1 shows results of Examples 1 to 11 and Comparative Examples 1 to 3. Table 2 shows the evaluation criteria of the etching rate and the reattachment. In Tables 1 and 2, a mark (Δ) means being acceptable as a product, a mark (○) means being better than mark (Δ), and a mark (×) means being no good. Judgment criteria of comprehensive evaluation are shown in Table 3. An excellent case in comprehensive evaluation that both of the etching rate and the reattachment are evaluated as the mark (○) and the selectivity between KNN film and Pt film (hereinafter referred to as "KNN/Pt" for short) is not less than 20 is judged as a mark (◎). The embodiments are carried out for the purpose of preventing the attaching of the etching residue after etching, and enhancing the etching rate so as to enhance the efficiency of manufacturing process, thus a case that reattachment of the etching residue is found on the surface, or a case that the attaching of the etching residue is not large but the etching rate is extremely low is judged as the mark (×). The reattachment of the etching residue after etching is evaluated by a method that the processed cross-sectional surface is visually observed by Scanning Electron Microscope (SEM) and the surface is analyzed by Energy Dispersive X-ray spectroscopy (EDX).

Examples 1 to 4

As shown in FIG. 3, in Examples 1 to 4, the dry etching was carried out by adjusting the antenna power under the condition that the bias power is fixed to 50 W. In Example 1 to which the antenna power of 400 W was applied, the etching rate was 28 nm/min, of which evaluation was judged as the mark (Δ) and the reattachment was not found, but the selectivity of KNN/Pt was extremely low as 9, thus the comprehensive evaluation thereof was judged as the mark (Δ). In Example 2 to which the antenna power of 600 W was applied, the etching rate was 50 nm/min, of which evaluation was judged as the mark (○) and the reattachment of the etching residue was not found, and the selectivity of KNN/Pt was high as 26, thus the comprehensive evaluation thereof was judged as the mark (◎). As shown in Table 1, in Example 3 of the antenna power of 800 W and Example 4 of the antenna power of 1000 W, both of the etching rate and the selectivity were obtained at a high level and the reattachment was not found. From the results of the Examples 1 to 4 shown in FIG. 3, it was found that the etching rate is proportional to the antenna power when the bias power is fixed.

Examples 5 to 7

As shown in FIG. 4, in Examples 5 to 7, the dry etching was carried out by adjusting the bias power under the condition that the antenna power is fixed to 800 W. In Example 5 to which the bias power of 100 W was applied, the etching rate was 140 nm/min, of which evaluation was judged as the mark (○), the selectivity of KNN/Pt was 33, and the reattachment was not found, thus the comprehensive evaluation thereof was judged as the mark (◎). In Example 6 to which the bias power of 150 W was applied, the reattachment of the etching residue was not found, the etching rate was high as 247 nm/min and of which evaluation was judged as the mark (○). The etching can be carried out at a high rate, thus the comprehensive evaluation thereof was judged as the mark (○), but the selectivity of KNN/Pt was low as 5. This is due to the fact that the bias power was higher than an appropriate power. Also, in Example 7, the same tendency as that of Example 6 was observed.

As shown in FIGS. 3 and 4, the etching rate was obtained at a high value under the condition of high antenna power and high bias power. In addition, the selectivity of the KNN film to Pt was obtained at a high value under the condition of high antenna power and low bias power. The maximum etching rate of the KNN film was 371.6 nm/min when the bias power was 250 W, and the selectivity of KNN/Pt was 85.8 when the antenna power was 1000 W, thus it can be understood that these properties are drastically enhanced in comparison with the conventional method.

From the above, it can be said that it is preferable to etch the piezoelectric film under the condition that the antenna power is not less than 500 W and the bias power is not more than 100 W, in order to realize the etching selectivity of not less than 20 as a process for microfabricating the piezoelectric film by dry etching at a short time and sufficiently removing the etching residue.

Figure 5:
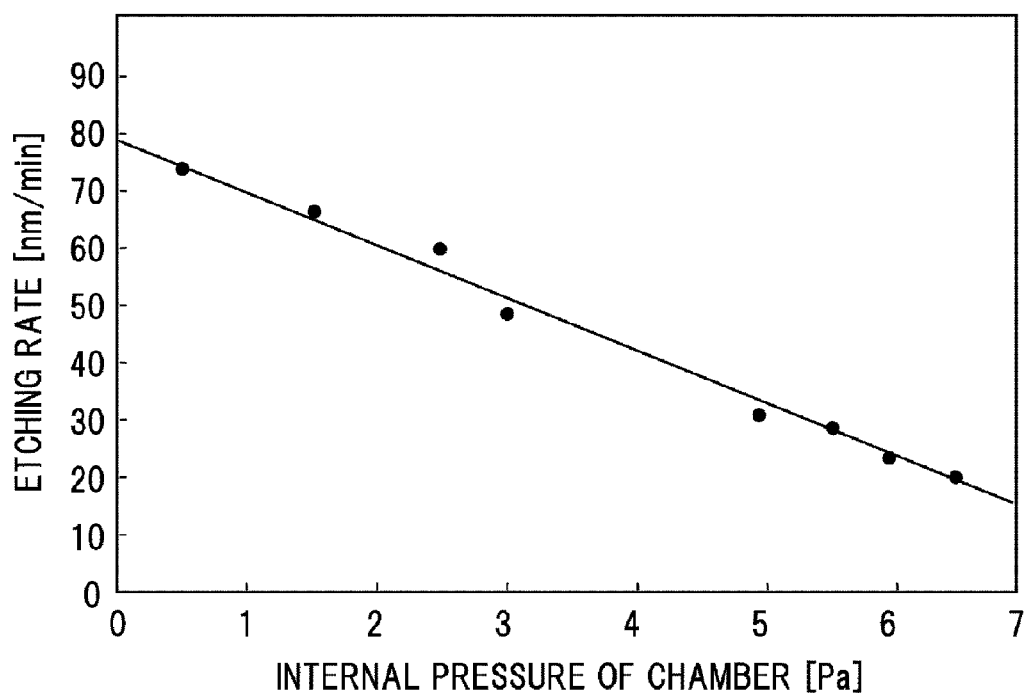
FIG. 5 is a graph showing an internal pressure of chamber (or chamber internal pressure) dependence of the etching rate of the KNN film.

Next, the result of etching was evaluated (refer to FIG. 5), the etching being carried out such that the condition thereof was fixed to the condition used in Example 3 that is one of preferable conditions in the above-mentioned Examples, while only the chamber internal pressure was changed.

Examples 8 and 9

In Examples 8 and 9 in which the etching was carried out within the preferable pressure range (in particular, 1.5 Pa and 2.5 Pa), the reattachment was not found, and both of the etching rate and the selectivity were good, thus the comprehensive evaluation thereof was judged as the mark (◎).

Examples 10 and 11

In Examples 10 and 11 in which the chamber internal pressure was low but slightly higher (in particular, 3 Pa and 5 Pa) than those of Examples 8 and 9, and the selectivity of KNN/Pt was respectively not less than 20, but the etching rate was slightly inferior as compared with a preferable case respectively, in particular, 47 nm/min in Example 10 and 30 nm/min in Example 11, thus the evaluation thereof was judged as the mark (Δ). In addition, the reattachment was found, thus the comprehensive evaluation thereof was judged as the mark (Δ).

Comparative Example 1

In Comparative Example 1 in which the chamber internal pressure was 5.5 Pa, the selectivity was good, but the reattachment was slightly found (judged as the mark (Δ) and the etching rate was low as 24 nm/min, thus the comprehensive evaluation thereof was judged as the mark (X).

Comparative Example 2

In Comparative Example 2 in which the chamber internal pressure was further increased to 6 Pa, both of the selectivity and the etching rate were obtained at a low value, and the reattachment of NaF and KF was found extensively, thus the evaluation was judged as the mark (X), and the comprehensive evaluation thereof was judged as the mark (X).

Comparative Example 3

Also, in Comparative Example 3 in which the chamber internal pressure was 6.5 Pa, the same tendency as that of Comparative Example 2 was observed, and the etching rate was low as 20 nm/min, thus it can be understood that shortening of manufacturing time cannot be expected.

From Examples 8 to 11 and Comparative Examples 1 to 3, it can be understood that the chamber internal pressure for etching is preferably not more than 5 Pa, and more preferably not more than 2.5 Pa.

From the above-mentioned result, it can be understood that the control of attaching of the etching residue and the etching rate also depends on the chamber internal pressure, and by controlling this, a preferable manufacturing can be achieved.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

TABLE 1

|  | Antenna power [W] | Bias power [W] | Pressure [Pa] | Etching rate [nm/min] | | KNN/Pt Selectivity | Reattachment | Comprehensive evaluation |
| --- | --- | --- | --- | --- | --- | --- | --- | --- |
| Example 1 | 400 | 50 | 0.5 | 28 | Δ | 9 | ○ | Δ |
| Example 2 | 600 | 50 | 0.5 | 50 | ○ | 26 | ○ | ◎ |
| Example 3 | 800 | 50 | 0.5 | 79.5 | ○ | 57 | ○ | ◎ |
| Example 4 | 1000 | 50 | 0.5 | 98 | ○ | 87 | ○ | ◎ |
| Example 5 | 800 | 100 | 0.5 | 140 | ○ | 33 | ○ | ◎ |
| Example 6 | 800 | 150 | 0.5 | 247 | ○ | 5 | ○ | ○ |
| Example 7 | 800 | 250 | 0.5 | 371.6 | ○ | 4 | ○ | ○ |
| Example 8 | 800 | 50 | 1.5 | 66 | ○ | 50 | ○ | ◎ |
| Example 9 | 800 | 50 | 2.5 | 60 | ○ | 45 | ○ | ◎ |
| Example 10 | 800 | 50 | 3 | 47 | Δ | 41 | Δ | Δ |
| Example 11 | 800 | 50 | 5 | 30 | Δ | 32 | Δ | Δ |
| Com. Ex. 1 | 800 | 50 | 5.5 | 24 | X | 21 | Δ | X |

TABLE 1-continued

| | Antenna power [W] | Bias power [W] | Pressure [Pa] | Etching rate [nm/min] | KNN/Pt Selectivity | | Reattachment | Comprehensive evaluation |
|---|---|---|---|---|---|---|---|---|
| Com. Ex. 2 | 800 | 50 | 6 | 23 | X | 17 | X | X |
| Com. Ex. 3 | 800 | 50 | 6.5 | 20 | X | 14.3 | X | X |

Com. Ex. 1: Comparative Example 1,
⊚: Particularly good,
○: Good,
Δ: Acceptable,
X: No good

TABLE 2

Evaluation criteria

| Etching rate | | Selectivity | | Reattachment | |
|---|---|---|---|---|---|
| Less than 25 | X | Less than 20 | | Reattachment of NaF and KF (in the most part) | X |
| Not less than 25 and less than 50 | Δ | Not less than 20 | | Reattachment of NaF and KF (in a part) | Δ |
| Not less than 50 | ○ | | | No reattachment | ○ |

○: Good,
Δ: Acceptable,
X: No good

TABLE 3

| Etching rate [nm/min] | KNN/Pt Selectivity | Reattachment | Comprehensive evaluation |
|---|---|---|---|
| ○ | Not less than 20 | ○ | ⊚ |
| ○ | Less than 20 | ○ | ○ |
| Δ | Not less than 20 | ○ | ○ |
| Δ | Less than 20 | ○ | Δ |
| Not less than Δ | Not less than 20 | ○ | Δ |
| Not less than Δ | Less than 20 | ○ | Δ |
| Not less than Δ | Not less than 20 | X | X |
| Not less than Δ | Less than 20 | X | X |
| X | — | Δ | X |
| X | — | X | X |

⊚: Particularly good,
○: Good,
Δ: Acceptable,
X: No good

What is claimed is:

1. A manufacturing method of a piezoelectric film element, comprising:
    forming a piezoelectric film comprising a lead-free alkali niobate based compound having a perovskite structure represented by a compositional formula of $(K_{1-x}Na_x)NbO_3$ on a substrate;
    forming a mask made of Cr, Ta, W, or Ti or a mask made of a laminated Cr, Ta, W or Ti body on the piezoelectric film; and
    dry-etching the piezoelectric film formed with the mask thereon by using a low-pressure plasma in an atmosphere including a fluorine-based reactive gas,
    wherein the forming of the piezoelectric film includes forming a lower electrode made of a metal including Pt on the substrate and forming the piezoelectric film on the lower electrode,
    wherein the dry-etching of the piezoelectric film includes etching the piezoelectric film in conditions for the etch selectivity between the piezoelectric film and the lower electrode to be not less than 20,
    wherein the conditions for the etch selectivity to be not less than 20 are that the pressure inside a chamber for the dry-etching is not lower than 0.5 Pa and not higher than 2.5 Pa, the bias power is not lower than 50 W and not higher than 100 W, and the antenna power is not lower than 600 W and not higher than 1000 W.

2. The manufacturing method according to claim 1, wherein the dry-etching of the piezoelectric film comprises using a mixed gas of at least one fluorine system reactive gas selected from the group consisting of $CHF_3$, $C_2F_6$, $CF_4$, $SF_6$, $C_4F_8$ and $C_3F_7I$, and Ar, or a mixed gas of ones of the fluorine system reactive gas.

3. The manufacturing method according to claim 1, wherein the dry-etching is conducted in a chamber at an internal pressure of not more than 2.5 Pa.

* * * * *